US012315779B1

(12) United States Patent
Gregory et al.

(10) Patent No.: US 12,315,779 B1
(45) Date of Patent: May 27, 2025

(54) VAPOR CHAMBER HEAT SPREADER FOR BARE DIE PROCESSORS

(71) Applicant: Amazon Technologies, Inc., Seattle, WA (US)

(72) Inventors: Luke Thomas Gregory, Mercer Island, TX (US); Ofer Katz, Kfar Yona (IL); Nafea Bshara, Cupertino, CA (US); Ali Elashri, Seattle, WA (US); Yotam Admon, Tsur Hadasa (IL); Shay Madar, Netanya (IL); Ziv Harel, Megido (IL)

(73) Assignee: Amazon Technologies, Inc., Seattle, WA (US)

( * ) Notice: Subject to any disclaimer, the term of this patent is extended or adjusted under 35 U.S.C. 154(b) by 355 days.

(21) Appl. No.: 17/179,296

(22) Filed: Feb. 18, 2021

(51) Int. Cl.
  *H01L 23/40* (2006.01)
  *H01L 23/427* (2006.01)
  *H01L 23/473* (2006.01)

(52) U.S. Cl.
  CPC ........ *H01L 23/4006* (2013.01); *H01L 23/427* (2013.01); *H01L 23/473* (2013.01); *H01L 2023/4068* (2013.01); *H01L 2023/4087* (2013.01)

(58) Field of Classification Search
  CPC . H01L 23/4006; H01L 23/427; H01L 23/473; H01L 2023/4068; H01L 2023/4087; H01L 23/367
  See application file for complete search history.

(56) References Cited

U.S. PATENT DOCUMENTS

| 6,082,443 | A  | * | 7/2000  | Yamamoto | F28D 15/046 174/15.2 |
| 6,189,601 | B1 | * | 2/2001  | Goodman  | F28F 1/22 165/104.33 |
| 6,269,866 | B1 | * | 8/2001  | Yamamoto | F28D 15/0233 174/15.2 |
| 8,462,508 | B2 | * | 6/2013  | Lankston | F28D 15/0233 361/689 |
| 2004/0244951 | A1 | * | 12/2004 | Dussinger | F28D 15/046 257/E23.088 |
| 2005/0280128 | A1 | * | 12/2005 | Mok | H01L 23/427 257/E23.088 |

(Continued)

OTHER PUBLICATIONS

U.S. Appl. No. 17/206,023, dated Mar. 18, 2021, Luke Thomas Gregory.

Primary Examiner — Bitew A Dinke
(74) Attorney, Agent, or Firm — Alexander A. Knapp; Kowert, Hood, Munyon, Rankin & Goetzel, P.C.

(57) ABSTRACT

A computer system includes a processor module comprising a vapor chamber heat spreader for removing heat from a bare die processor. The vapor chamber heat spreader may be coupled with the bare die processor via a mounting structure. The vapor chamber heat spreader may have a pedestal that extends towards the bare die processor, such that a bottom surface of the pedestal is positioned proximate a top surface of the bare die processor. In various embodiments, the processor module may be configured to enable servicing of one or more components. For example, the processor module may have a mechanism that allows for uncoupling the vapor chamber heat spreader from the bare die processor, so as to enable replacement of the bare die processor in some embodiments.

19 Claims, 9 Drawing Sheets

(56) References Cited

U.S. PATENT DOCUMENTS

| | | | |
|---|---|---|---|
| 2007/0053152 A1* | 3/2007 | Ouyang | G06F 1/20 361/679.54 |
| 2007/0145574 A1* | 6/2007 | Colbert | H01L 23/427 438/117 |
| 2007/0258213 A1* | 11/2007 | Chen | H01L 23/427 257/E23.088 |
| 2008/0044949 A1* | 2/2008 | Colbert | H01L 23/3672 257/E23.087 |
| 2008/0197483 A1* | 8/2008 | Ouyang | H01L 23/4006 438/122 |
| 2008/0266800 A1* | 10/2008 | Lankston | F28F 3/02 29/890.032 |
| 2009/0151905 A1* | 6/2009 | Lai | F28D 15/04 165/104.26 |
| 2009/0151906 A1* | 6/2009 | Lai | F28D 15/046 165/104.26 |
| 2009/0195984 A1* | 8/2009 | Meyer, IV | H01L 23/427 361/700 |
| 2009/0218078 A1* | 9/2009 | Brunschwiler | G06F 1/20 361/679.53 |
| 2011/0149518 A1* | 6/2011 | Salamon | H05K 7/20454 361/704 |
| 2013/0039012 A1* | 2/2013 | Shih | H01L 23/473 361/700 |
| 2015/0043167 A1* | 2/2015 | Guenin | H01L 23/427 361/719 |
| 2015/0285562 A1* | 10/2015 | Huang | B23P 15/26 29/890.032 |
| 2016/0141831 A1* | 5/2016 | Li | H01S 5/02476 257/712 |
| 2016/0284670 A1* | 9/2016 | Hung | H01L 25/50 |
| 2017/0092561 A1* | 3/2017 | Eid | H01L 21/4878 |
| 2017/0230011 A1* | 8/2017 | Patel | H05K 3/3463 |
| 2018/0270993 A1* | 9/2018 | Kulkarni | F28D 15/046 |
| 2019/0035713 A1* | 1/2019 | Prajapati | H05K 7/20336 |
| 2019/0206764 A1* | 7/2019 | Kulkarni | H01L 23/433 |
| 2019/0239395 A1* | 8/2019 | Joshi | F28D 15/046 |
| 2019/0327859 A1* | 10/2019 | Iyengar | H05K 7/20772 |
| 2019/0348345 A1* | 11/2019 | Parida | H01L 25/18 |
| 2020/0100396 A1* | 3/2020 | Iyengar | H05K 7/20254 |
| 2020/0152546 A1* | 5/2020 | Refai-Ahmed | H01L 23/481 |
| 2020/0350229 A1* | 11/2020 | Chang | H01L 23/3733 |
| 2021/0010757 A1* | 1/2021 | Hachiya | H05K 7/20 |
| 2021/0195798 A1* | 6/2021 | Neal | H01L 23/3675 |
| 2021/0272873 A1* | 9/2021 | Kazem | C09K 5/12 |
| 2022/0087065 A1* | 3/2022 | Nguyen | H05K 7/20336 |
| 2022/0102288 A1* | 3/2022 | Hung | H01L 21/52 |
| 2022/0151113 A1* | 5/2022 | Hachiya | H05K 7/1427 |
| 2022/0264741 A1* | 8/2022 | Damaraju | H05K 7/20272 |

* cited by examiner

VAPOR CHAMBER HEAT SPREADER FOR BARE DIE PROCESSORS

BACKGROUND

Some computer systems include a number of components that generate waste heat. Such components include printed circuit boards, mass storage devices, power supplies, and processors. For example, some computers with multiple processors may generate 400 watts of waste heat. Some known computer systems include a plurality of such larger, multiple-processor computers that are configured into rack-mounted components, and then are subsequently positioned within a rack system. Some known rack systems include 40 such rack-mounted components and such rack systems will therefore generate as much as 30 kilowatts of waste heat. Moreover, some known data centers include a plurality of such rack systems.

Some computer systems, which may function as servers, include a number of components that are mounted in an interior of the computer systems. The components, which can include printed circuit boards (for example, a motherboard) and mass storage devices, can support one or more components that generate waste heat, referred to herein as "heat-producing components." For example, a motherboard can support a central processing unit, and mass storage devices can include hard disk drives which include motors and electronic components that generate heat. Mass storage devices can also include solid state drives that generate heat. Some or all of this heat must be removed from the components to maintain continuous operation of a computer system.

Figure 1:
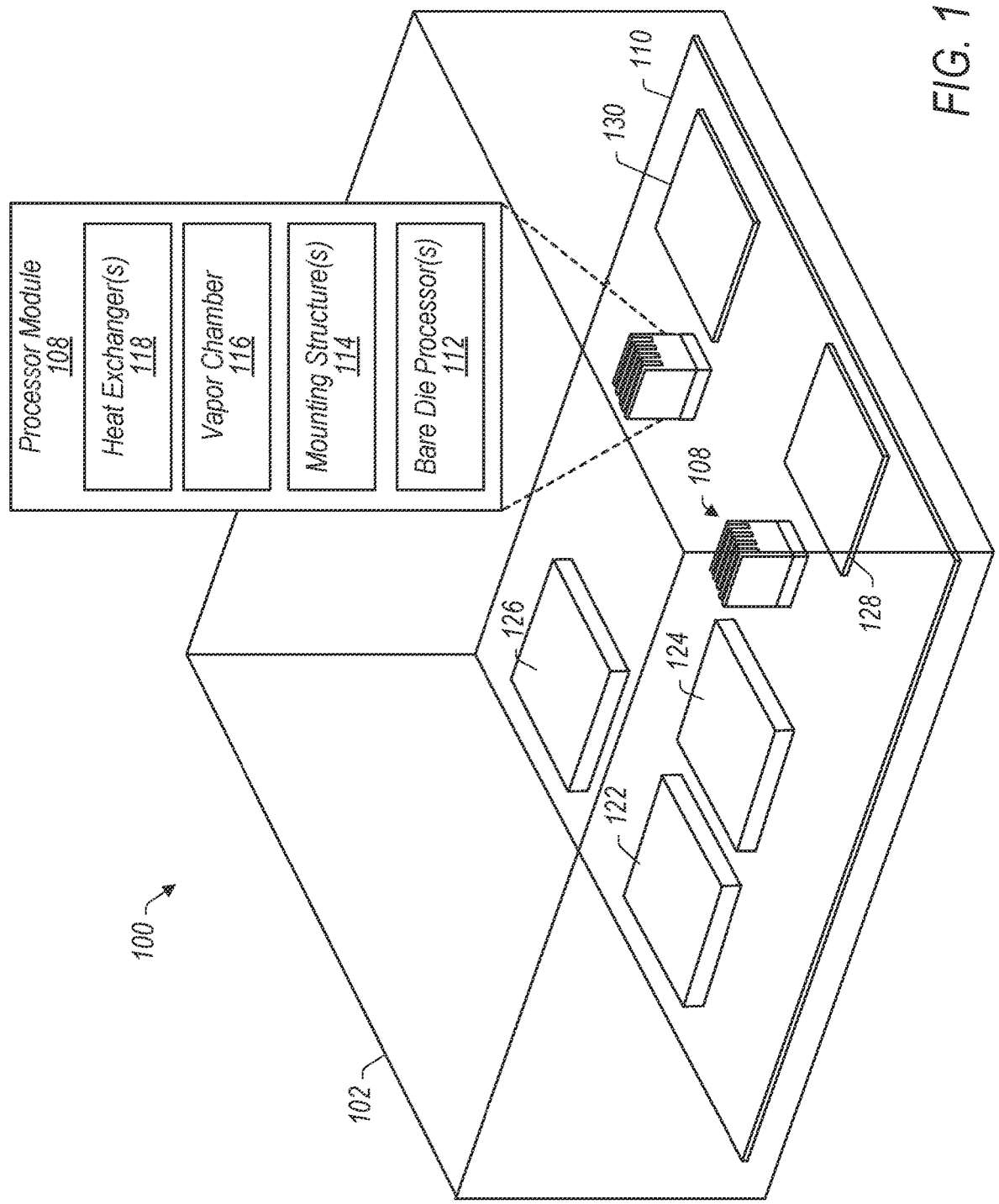
FIG. 1 is a perspective view of an example computer system that includes a processor module comprising a vapor chamber heat spreader for removing heat from a bare die processor, according to some embodiments.

The various embodiments described herein are susceptible to various modifications and alternative forms. Specific embodiments are shown by way of example in the drawings and will herein be described in detail. It should be understood, however, that the drawings and detailed description thereto are not intended to limit the disclosure to the particular form disclosed, but on the contrary, the intention is to cover all modifications, equivalents and alternatives falling within the spirit and scope of the appended claims. The headings used herein are for organizational purposes only and are not meant to be used to limit the scope of the description or the claims. As used throughout this application, the word "may" is used in a permissive sense (i.e., meaning having the potential to), rather than the mandatory sense (i.e., meaning must). Similarly, the words "include," "including," and "includes" mean including, but not limited to.

DETAILED DESCRIPTION OF EMBODIMENTS

Various embodiments include a processor module comprising a vapor chamber heat spreader for removing heat from a bare die processor. The vapor chamber heat spreader may be coupled with the bare die processor via a mounting structure. The vapor chamber heat spreader may have a pedestal that extends towards the bare die processor, such that a bottom surface of the pedestal is positioned proximate a top surface of the bare die processor. A thermal interface material (TIM) may be disposed between the bottom surface of pedestal and the top surface of the bare die processor, e.g., so as to be in contact with both the pedestal and the bare die processor. In various embodiments, the processor module may be considered a "serviceable" processor module, as it may be configured to enable servicing of one or more of its components. For example, the processor module may have a mechanism that allows for uncoupling the vapor chamber heat spreader from the bare die processor, so as to enable replacement of the bare die processor in some embodiments.

In some embodiments, the interface between the vapor chamber heat spreader and the bare die processor (e.g., via the TIM) may enable improved thermal performance, relative to some other arrangements in which a conductive material layer of a processor package is in contact with a heat exchanger (e.g., a heat sink). Such a conductive layer may have a higher thermal resistance than the interface between the vapor chamber heat spreader and the bare die processor disclosed herein. In some embodiments, the vapor chamber heat spreader may function as a lid for the bare die processor.

Furthermore, the bare die processor may have a small contact area, which may present challenges to mounting a heat exchanger with respect to mounting force and achieving desired parallelity between the heat exchanger and the bare die processor. A high degree of control may be needed to achieve the desired parallelity, which may present difficulties in terms of servicing. A data center, for example, may not be equipped with appropriate manufacturing fixtures and tooling. By integrating a vapor chamber heat spreader on top of the bare die, as disclosed herein, the heat exchanger can be mounted onto a larger surface area (e.g., the top surface of the vapor chamber heat spreader). This may provide flexibility for mounting heat sinks that might typically contact a lid for a CPU, for example. A higher contact force may be used, as there is more compliance due to the TIM disposed between the pedestal and the bare die processor, and there may be less risk of damaging (e.g., cracking) the die because of the vapor chamber heat spreader's heat spreading capabilities.

As used herein, "bare die" means an unpackaged chip. A bare die processor, for example, may be an unpackaged, bare processor chip. By contrast, in a packaged processor, a die is encapsulated within a housing.

As used herein, "chassis" means a structure or element that supports another element or to which other elements can be mounted. A chassis may have any shape or construction, including a frame, a sheet, a plate, a box, a channel, or a combination thereof. In one embodiment, a chassis is made from one or more sheet metal parts. A chassis for a computer system may support circuit board assemblies, power supply units, data storage devices, a heat exchanger, cables, and other components of the computer system.

As used herein, "computing" includes any operations that can be performed by a computer, such as computation, data storage, data retrieval, or communications.

As used herein, "computer system" includes any of various computer systems, computing devices, or components thereof. One example of a computer system is a rack-mounted server. As used herein, the term computer is not limited to just those integrated circuits referred to in the art as a computer, but broadly refers to a processor, a server, a microcontroller, a microcomputer, a programmable logic controller (PLC), an application specific integrated circuit, and other programmable circuits, and these terms are used interchangeably herein. In the various embodiments, memory may include, but is not limited to, a computer-readable medium, such as a random access memory (RAM). Alternatively, a compact disc-read only memory (CD-ROM), a magneto-optical disk (MOD), and/or a digital versatile disc (DVD) may also be used. Also, additional input channels may include computer peripherals associated with an operator interface such as a mouse and a keyboard. Alternatively, other computer peripherals may also be used that may include, for example, a scanner. Furthermore, in the some embodiments, additional output channels may include an operator interface monitor and/or a printer.

As used herein, "data center" includes any facility or portion of a facility in which computer operations are carried out. A data center may include servers dedicated to specific functions or serving multiple functions. Examples of computer operations include information processing, communications, testing, simulations, power distribution and control, and operational control. Computer systems as described herein may be mounted in racks included in a data center in some embodiments.

FIG. 1 is a perspective view of an example computer system that includes a processor module comprising a vapor chamber for removing heat from one or more bare die processors, according to some embodiments.

Computer system 100 may include various computing components positioned inside of chassis 102. In various embodiments, the computer system 100 includes heat-producing components. For example, the computer system 100 may include one or more processors, such as central processing units (CPUs) and/or graphics processing units (GPUs) that generate significant amounts of waste heat that needs to be removed.

In some embodiments, the computer system 100 may include one or more processor modules 108 coupled to a circuit board 110 (e.g., a printed circuit board (PCB)). For example, a processor module 108 may include one or more bare die processors 112, one or more mounting structures 114, a vapor chamber 116 (e.g., a vapor chamber heat spreader), and/or one or more heat exchangers 118 in some embodiments. According to various embodiments, the vapor chamber heat spreader 116 may be configured to remove heat from the bare die processor(s) 112. The mounting structure(s) 114 may be configured to mount the vapor chamber heat spreader 116 to the circuit board 110 over the bare die processor(s) 112. For example, the mounting structure(s) 114 may be used to mount the vapor chamber heat spreader 116 such that a bottom surface of the vapor chamber heat spreader 116 is disposed within an interior portion of the processor module 108 and is positioned proximate a top surface of a bare die processor 112. In some non-limiting embodiments, the mounting structure(s) 114 may comprise one or more nickel-plated steel brackets. Additionally, or alternatively, the mounting structure(s) 114 may include a mounting bracket that may be soldered and/or brazed to the vapor chamber heat spreader 116.

In various embodiments, the vapor chamber heat spreader 116 may include a wicking structure positioned between a top cover and a bottom cover. The top cover and the bottom cover may be configured to encase at least a portion of the wicking structure. The heat exchanger(s) 118 may be attached to a top surface of the top cover. The bottom cover may comprise a pedestal that extends out from a surface of the bottom cover, in a direction opposite the top cover. The bottom surface of the vapor chamber heat spreader 116 may be the bottom surface of the pedestal. Furthermore, the bottom surface of the pedestal may be sized to match the top surface of the bare die processor 112. A thermal interface material (TIM) (e.g., a thermal grease, thermal gel, thermal putty, and/or a thermal paste, etc.) may be in contact with the top surface of the bare die processor 112 and the bottom surface of the pedestal, e.g., such that the bottom surface of the pedestal is in thermal communication with the top surface of the bare die processor 112 via the TIM. The TIM may be used to enhance thermal coupling between the vapor chamber heat spreader 116 and the bare die processor 112. These and other aspects of the processor module 108 are discussed in further detail herein with reference to FIGS. 2-8.

The computing system 100 may include other heat producing components that may generate less waste heat than the processors. For example, the computing system 100 may include storage devices 122, 124, and 126, which may be hard disk drives and/or solid state memory devices. Also, the computing system 100 may include other heat producing components such as circuits 128 and 130. Note that in various embodiments, the computing system 100 may include various types of heat producing components, such as CPUs, GPUS, hard drives, solid-state memory devices, memory cards, field programmable gate arrays (FPGAs), application specific integrated circuits (ASICs), various other types of memory or storage devices, processors, control circuits, etc.

Figure 2:
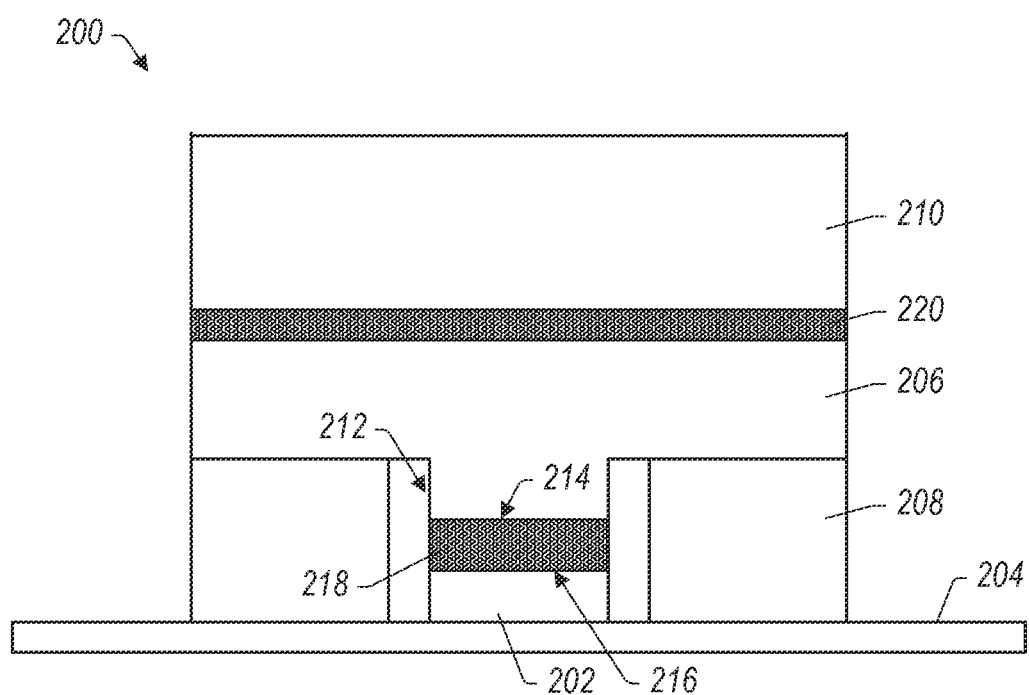
FIG. 2 is a schematic side cross-sectional view of an example processor module that includes a vapor chamber heat spreader for removing heat from a bare die processor, according to some embodiments.

FIG. 2 is a schematic side cross-sectional view of an example processor module 200 that includes a vapor chamber heat spreader for removing heat from a bare die processor, according to some embodiments.

In various embodiments, the processor module 200 may include a bare die processor 202 mounted on a circuit board 204. For example, the bare die processor 202 may be soldered to the circuit board 204 or may be mounted to the circuit board 204 via a socket. Furthermore, the processor module 200 may include a vapor chamber heat spreader 206, one or more mounting structures 208, and/or one or more heat exchangers 210 (e.g., an extruded aluminum heat sink, a copper heat sink, a heat sink with a heat pipe, and/or a liquid cold plate, etc.). The vapor chamber heat spreader 206 may include a pedestal 212 that protrudes downwards towards the bare die processor 202. In various embodiments, a bottom surface 214 of the pedestal 212 may not be in direct contact with a top surface 216 of the bare die processor 202. A thermal interface material (TIM) 218 may be disposed between the pedestal 212 and the bare die processor 202, e.g., as indicated in FIG. 2. The TIM 218 may be in contact with the bottom surface 214 of the pedestal 212 and with the top surface 216 of the bare die processor 202.

According to various embodiments, the vapor chamber heat spreader 206 may be configured to remove heat from the bare die processor 202. The mounting structure(s) 208 may be used to mount the vapor chamber heat spreader 206 to the circuit board 204 over the bare die processor 202. For example, the mounting structure(s) 208 may be used to mount the vapor chamber heat spreader 206 such that the bottom surface 214 of the pedestal 212 is disposed within an interior portion of the processor module 200 and is positioned proximate a top surface of a bare die processor 202. As further discussed with reference to FIGS. 3, 5A, and 5B, the mounting structure(s) 208 may include, e.g., a mounting bracket (e.g., mounting bracket 308 in FIG. 3) and a retention bracket (or "retention ring") (e.g., retention bracket 310 in FIG. 3). The mounting bracket may be attached to the vapor chamber heat spreader 206, and the retention bracket may be attached to the circuit board 204. The mounting bracket may be used to add rigidity to the vapor chamber heat spreader 206. Furthermore, the retention bracket may be used to add rigidity to the circuit board 204. For example, the mounting bracket and/or the retention bracket may have a respective larger cross-section of solid metal material that resists bending and/or torsion to a greater degree, relative to a respective thinner (and/or hollow) cross-section of the vapor chamber heat spreader 206 or the circuit board 204. Furthermore, the material(s) chosen for the mounting bracket and/or the retention bracket may have a greater modulus of elasticity than the materials of the vapor chamber heat spreader 206 or the circuit board 204. In some non-limiting examples, the mounting bracket and the retention bracket may be formed out of steel (or nickel-plated steel) that has a greater modulus of elasticity than a copper material used for the vapor chamber heat spreader 206 or a silicon material used for the circuit board 204. In some embodiments, the vapor chamber heat spreader 206 and the mounting bracket may be coupled to the retention bracket via one or more removable fasteners, which may enable serviceability of the processor module 200, e.g., as discussed herein with reference to FIGS. 3, 5A, 5B, 7, and 8.

Figure 4:
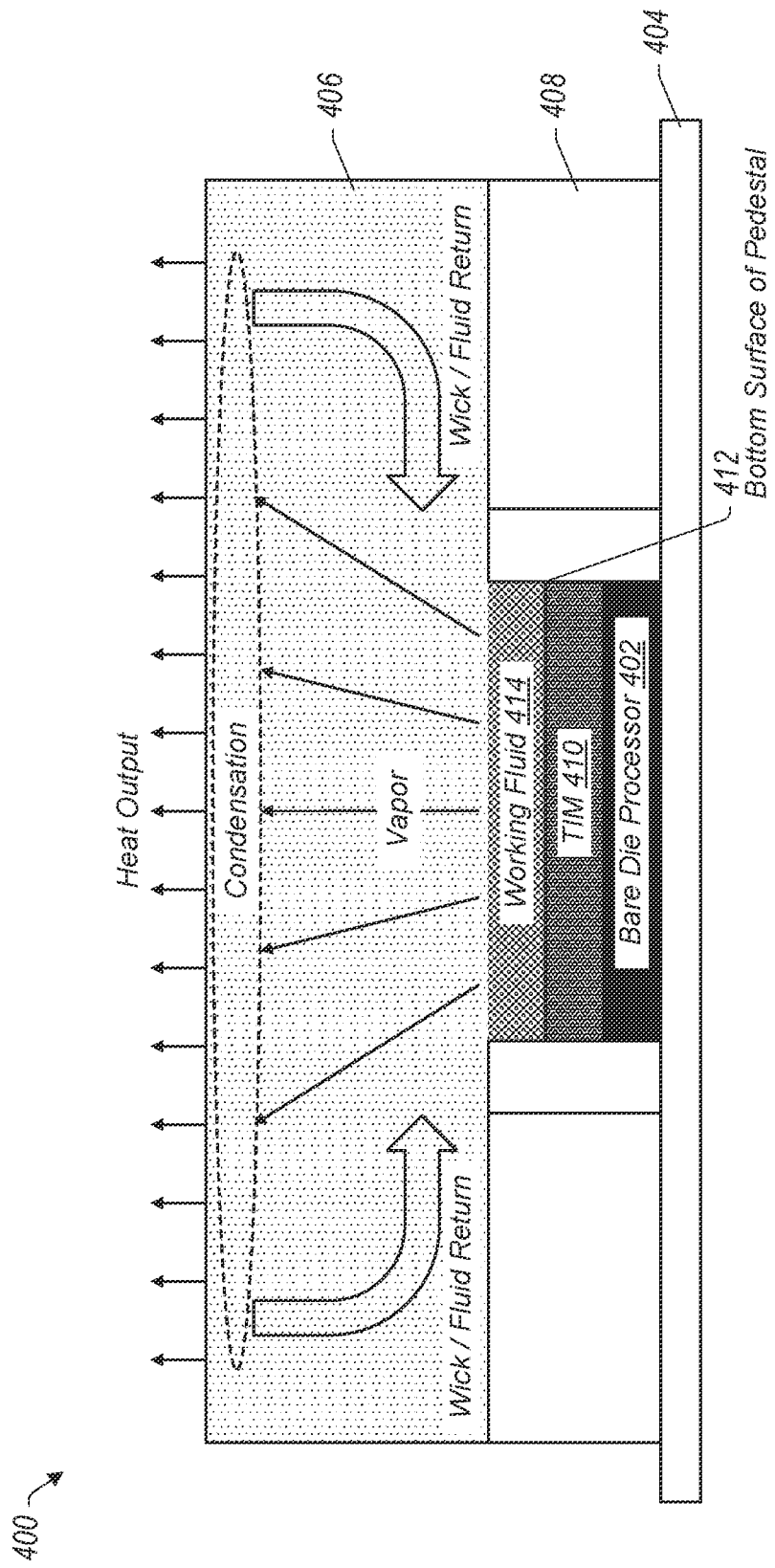
FIG. 4 is a schematic side cross-sectional view of an example processor module that includes a vapor chamber heat spreader for removing heat from a bare die processor, according to some embodiment.

In various embodiments, heat produced by the bare die processor 202 may be transferred to the vapor chamber heat spreader 206 via the TIM 218. The vapor chamber heat spreader 206 may spread the heat from a small surface area (e.g., corresponding to the top surface 216 of the bare die processor 202 and/or the bottom surface 214 of the pedestal 212 of the vapor chamber heat spreader 206) to a relatively larger surface area (e.g., corresponding to a top surface of the vapor chamber heat spreader 206). The description herein with reference to FIG. 4 provides an example of the inner workings of the vapor chamber heat spreader 206 according to some embodiments. Heat output from the top surface of the vapor chamber heat spreader 206 may be transferred to the heat exchanger(s) 210, e.g., to dissipate the heat away from the bare die processor 202. In various embodiments, a TIM 220 (which may be the same as, or different from, TIM 218) may be disposed between the top surface of the vapor chamber heat spreader 206 and the heat exchanger(s) 210.

Figure 3:
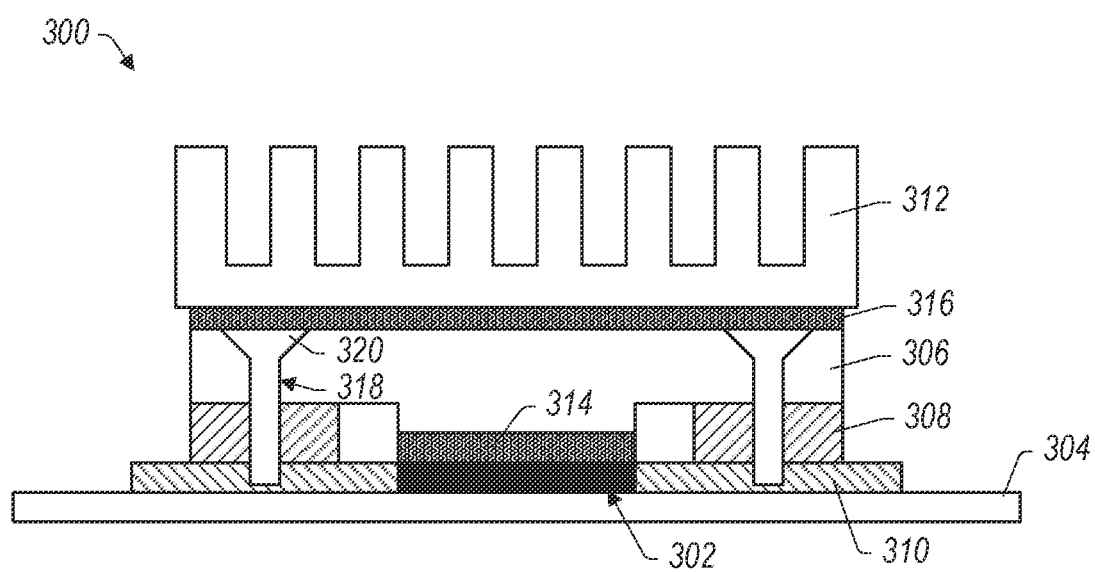
FIG. 3 is a side cross-sectional view of an example serviceable processor module that includes a vapor chamber heat spreader for removing heat from a bare die processor, according to some embodiments.

FIG. 3 is a side cross-sectional view of an example serviceable processor module 300 that includes a vapor chamber heat spreader for removing heat from a bare die processor, according to some embodiments.

In some embodiments, the processor module 300 may include a bare die processor 302 mounted on a circuit board 304. Furthermore, the processor module 300 may include a vapor chamber heat spreader 306, a mounting structure (e.g., comprising a mounting bracket 308 and a retention bracket 310), and/or one or more heat exchangers (e.g., heat sink 312 mounted on a top surface of the vapor chamber heat spreader 306). The vapor chamber heat spreader 306 may include a pedestal that protrudes downwards towards the bare die processor 302. A thermal interface material (TIM) 314 may be sandwiched between the bottom surface of the pedestal of the vapor chamber heat spreader 306 and the top surface of the bare die processor 302. Furthermore, a TIM 316 (which may be the same as, or different from, TIM 314) may be disposed between the top surface of the vapor chamber heat spreader 306 and the heat sink 312.

According to some embodiments, the processor module 300 may include removable fasteners for coupling the vapor chamber heat spreader to the mounting structure. As indicated in FIG. 3, the vapor chamber heat spreader 306 and the mounting structure may define holes 318 for receiving the removable fasteners. In some embodiments, the holes 318 may comprise through holes defined by the vapor chamber heat spreader 306 and/or the mounting bracket 308. Furthermore, the holes 318 may comprise holes defined by the retention bracket 310. Respective holes defined by the mounting structure may be coaxial with the holes defined by the vapor chamber heat spreader 306. In some non-limiting examples, the removable fasteners may include one or more screws. One or more of the holes 318 may have a countersink 320 (or a counterbore) configured to accommodate a head of a screw, e.g., such that a top surface of the head is flush with, or below, the top surface of the vapor chamber heat spreader when the vapor chamber heat spreader is coupled to the mounting structure via the screw. This may allow for flat attachment of the heat sink 312 to the top surface of the vapor chamber heat spreader 306, e.g., such that a bottom surface of the heat sink is parallel to the top surface of the vapor chamber heat spreader 306. The removable fasteners may be removed in order to uncouple the vapor chamber heat spreader 306 from the bare die processor 302, enabling servicing of the processor module 300 (hence use of the term "serviceable" in "serviceable processor module"). Servicing the processor module 300 may include repairing and/or replacing one or more components that would otherwise be inaccessible without damaging component(s) and/or rendering component(s) inoperable. For example, servicing the processor module 300 may include replacing the bare die processor 302 (e.g., method 900 in FIG. 9) and/or replacing the vapor chamber heat spreader 306 (e.g., method 1000 in FIG. 10).

FIG. 4 is a schematic side cross-sectional view of an example processor module 400 that includes a vapor chamber heat spreader for removing heat from a bare die processor, according to some embodiment.

In some embodiments, the processor module 400 may include a bare die processor 402 mounted on a circuit board 404. Furthermore, the processor module 400 may include a vapor chamber heat spreader 406, a mounting structure 408 (e.g., comprising mounting bracket 308 and retention bracket 310 in FIG. 3), and/or one or more heat exchangers (not shown). The vapor chamber heat spreader 406 may include a pedestal that protrudes downwards towards the bare die processor 402. A thermal interface material (TIM) 410 may be disposed between the bottom surface 412 of the pedestal of the vapor chamber heat spreader 406 and the top surface of the bare die processor 402.

In various embodiments, heat produced by the bare die processor 402 may be transferred to the vapor chamber heat spreader 406 via the TIM 410. A working fluid 414 (e.g., de-ionized water that is at its saturation point) may be contained within a working fluid reservoir defined by the pedestal of the vapor chamber heat spreader 406. Heat from the bare die processor 402, that is transferred to the pedestal via the TIM 410, may cause the working fluid 414 to evaporate, and thus molecules of water vapor may flow omnidirectionally as indicated by the "vapor" arrows in FIG. 4. When heat is removed from the vapor, e.g., at the "condensation" region (where the vapor reaches the top of the vapor chamber heat spreader 406), the vapor condenses into fluid and returns to the working fluid reservoir via capillary action/wicking due to the wicking structure (e.g., wicking structure 520 discussed herein with reference to FIG. 5B) within the vapor chamber heat spreader 406, as indicated by the "wick/fluid return" arrows in FIG. 4.

Figure 5A:
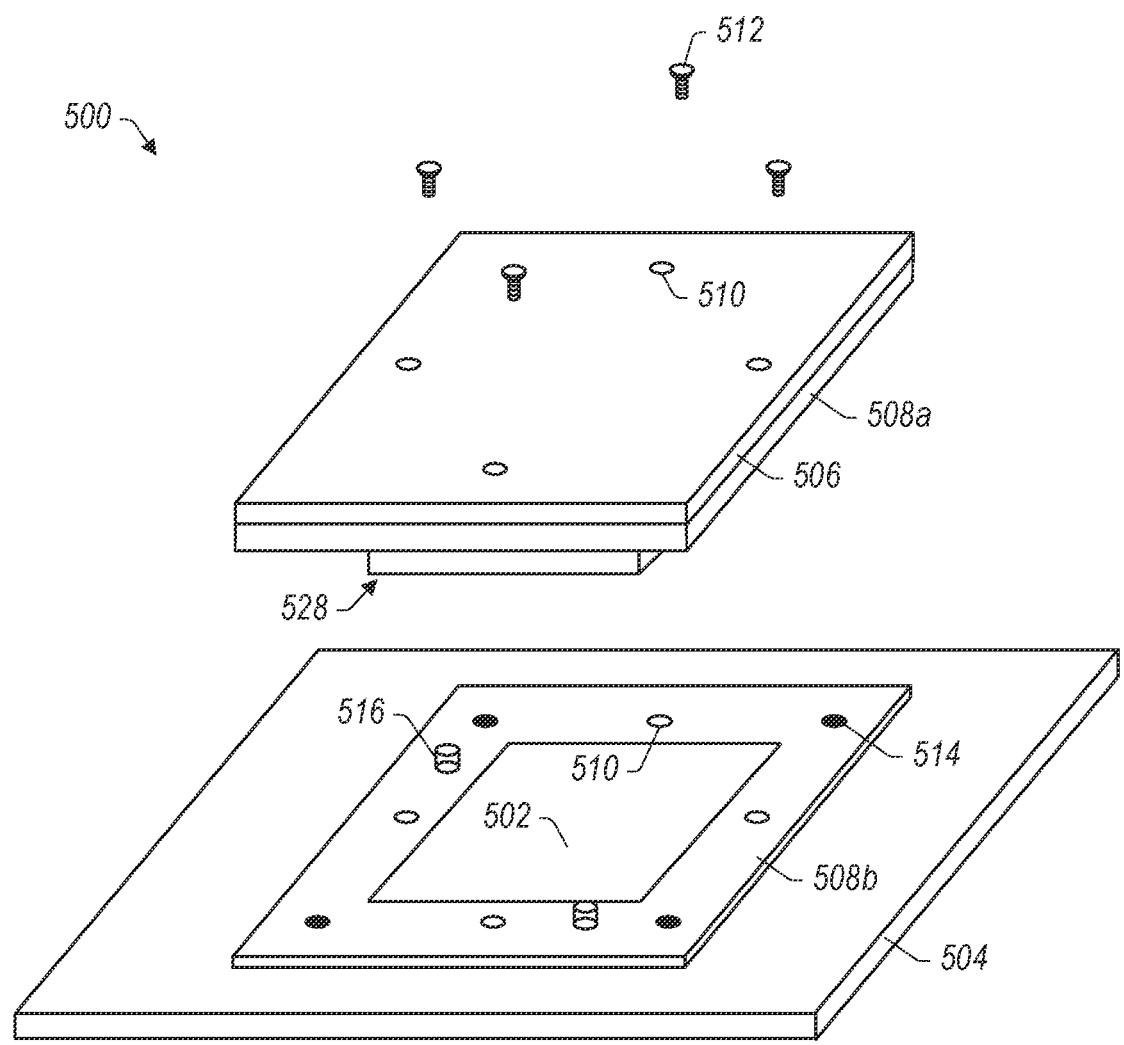
FIG. 5A is a partially exploded perspective view of an example serviceable processor module that includes a vapor chamber heat spreader for removing heat from a bare die processor, according to some embodiments.
Figure 5B:
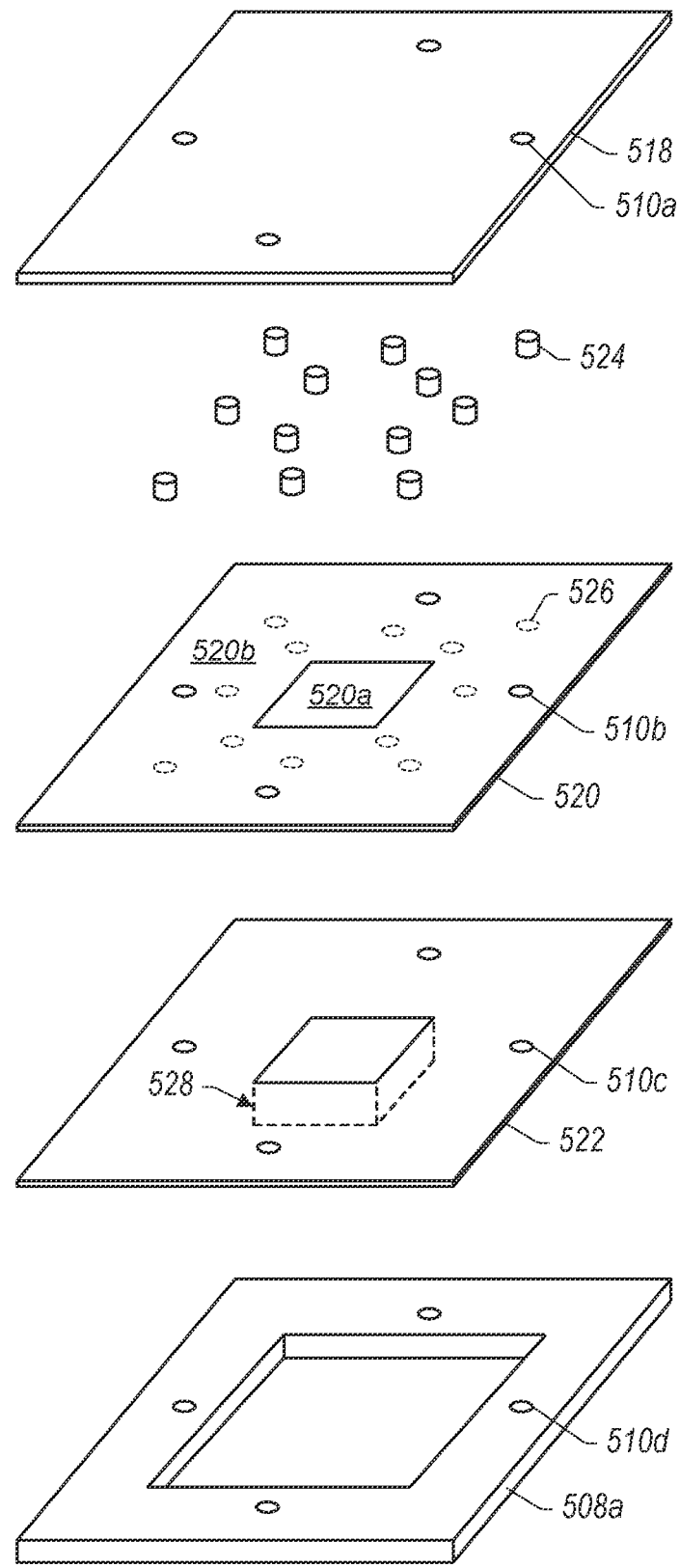
FIG. 5B is an exploded perspective view of an example vapor chamber heat spreader and at least a portion of an example mounting structure that may be used to mount the vapor chamber heat spreader over a bare die processor, according to some embodiments.

FIG. 5A is a partially exploded perspective view of an example serviceable processor module 500 that includes a vapor chamber heat spreader for removing heat from a bare die processor, according to some embodiments. FIG. 5B is an exploded perspective view of the vapor chamber heat spreader and at least a portion of an example mounting structure that may be used to mount the vapor chamber heat spreader over the bare die processor.

In some embodiments, the processor module 500 may include a bare die processor 502. The bare die processor 502 may be coupled to the circuit board 504. Furthermore, the processor module 500 may include a vapor chamber heat spreader 506, a mounting structure (e.g., comprising mounting bracket 508a and/or retention bracket 508b), and/or a heat exchanger (not shown in FIGS. 5A-5B).

In some embodiments, the processor module 500 may include holes 510 (e.g., coaxial holes 510a-510d in FIG. 5B) for receiving fasteners 512 (e.g., removable fasteners, such as, but not limited to, screws) that may be used to couple the vapor chamber heat spreader 506 with the bare die processor 502 and/or the circuit board 504, e.g., via the mounting structure. In some embodiments, the retention bracket 508b may define holes 514 for receiving fasteners that may be used to attach the retention bracket 508b to the circuit board 504. Furthermore, the processor module 500 may include guide pins 516, which may be used to guide relative placement of components as they are drawn together for coupling. For example, the guide pins 516 may protrude upwards from the retention bracket 508b, and an underside of the mounting bracket 508a may define corresponding recesses for mating with the guide pins 516. Additionally, or alternatively, one or more guide pins may protrude downward from the mounting bracket 508a, and an upper side of the retention bracket 508b may define one or more corresponding recesses for mating with such guide pins.

As indicated in FIG. 5B, the vapor chamber heat spreader 508 may include a top cover 518 (e.g., comprising a copper plate), a wicking structure 520, and a bottom cover 522 (e.g., comprising a copper plate) in some embodiments. The wicking structure 520 may be positioned between the top cover 518 and the bottom cover 522. In some non-limiting embodiments, the wicking structure 520 may include two copper 300-mesh (or higher) sheets. According to various embodiments, the wicking structure 520 may include a first wick portion 520a and a second wick portion 520b, e.g., as indicated in FIG. 5B. The first wick portion 520a may include a sintered wick. The second wick portion 520b may include a screen wick (e.g., 300-mesh sheets) that encircles a periphery of the first wick portion 520a. The sintered wick (of the first wick portion 520a) may be formed using a sintering process, in which heat and/or compression is applied to copper particles (e.g., powder, spheres, etc.) to coalesce the copper particles into a porous structure. The sintering process and/or another process may be used to bond the sintered wick to the screen wick (of the second wick portion 520b). As discussed herein with reference to FIG. 4, the vapor chamber heat spreader 508 may include working fluid (within a working fluid reservoir) that is evaporated, condensed, and then wicked back to the working fluid reservoir. The second wick portion 520b may be configured to wick the condensed fluid to the first wick portion 520a. In turn, the first wick portion 520a may be configured to wick the condensed fluid back to the working fluid reservoir. In some embodiments, the first wick portion 520a may be configured to wick the condensed fluid such that it predominantly travels, via capillary action, in a first direction (e.g., a horizontal direction), and the second wick portion 520b may be configured to wick the condensed fluid such that it predominantly travels, via capillary action, in a second direction (e.g., a vertical direction) orthogonal to the first direction.

According to various embodiments, the vapor chamber heat spreader 508 may include copper pillars 524 (e.g., within holes 526 in the wicking structure 520) used for supporting load forces on the vapor chamber heat spreader 508 that may otherwise cause the vapor chamber heat spreader 508 to collapse.

In various embodiments, the bottom cover 522 may comprise a pedestal 528 that extends out from a surface of the bottom cover 522, in a direction opposite the top cover 518. According to some embodiments, the pedestal 528 may be formed by stamping a sheet of copper that is used for the bottom cover 522. A bottom surface of the pedestal 528 may be a flat surface that dimensionally matches a top surface of the bare die processor 502. According to various embodiments, the holes 510 may be arranged so as to at least partially encircle the pedestal 528, with respect to directions along a plane that is parallel to the bottom surface of the pedestal 528.

In some embodiments, the vapor chamber heat spreader 508 may be configured such that, when coupled with the mounting structure, the bottom surface of the pedestal 528 is not in direct contact with the top surface of the bare die processor 502. In some embodiments, the bottom surface of the pedestal 528 is in contact with a thermal interface material (TIM) that is also in contact with the top surface of the bare die processor 502.

Figure 6:
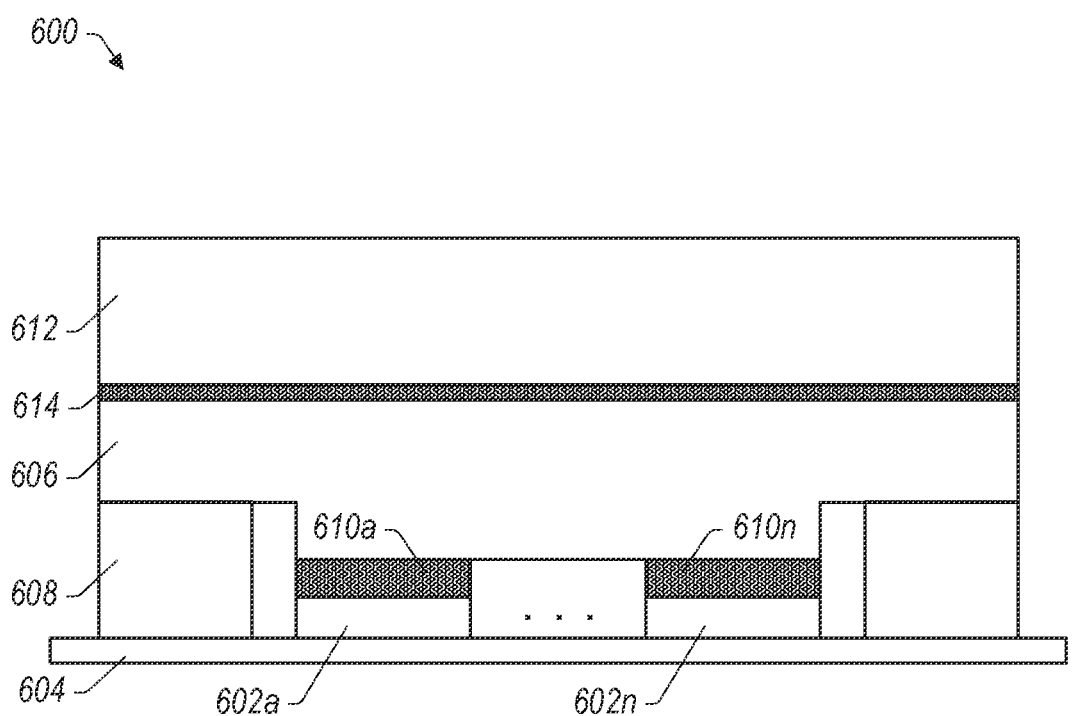
FIG. 6 is a schematic side cross-sectional view of an example multi-chip module that includes a vapor chamber heat spreader for removing heat from multiple bare die processors, according to some embodiments.

FIG. 6 is a schematic side cross-sectional view of an example multi-chip module 600 that includes a vapor chamber heat spreader for removing heat from multiple bare dies, according to some embodiments.

In some embodiments, the multi-chip module 600 may include multiple bare dies (e.g., bare dies 602a-602n, which may be coupled to a substrate 604). The vapor chamber heat spreader 606 may be coupled with the bare dies 602a-602n via a mounting structure 608. The vapor chamber heat spreader 606 may include a pedestal that protrudes towards the bare dies p602a-602n. One or more thermal interface materials (TIMs) 610a-610n (which may be the same as, or different from, each other) may be disposed between the pedestal and the bare dies 602a-602n, e.g., as indicated in FIG. 6. A heat exchanger 612 (e.g., a heat sink) may be mounted on top of the vapor chamber heat spreader 606. A TIM 614 (which may be the same as, or different from, one or more of TIMs 610a-610n) may also be disposed between the top surface of the vapor chamber heat spreader 606 and a bottom surface of the heat exchanger 612.

Figure 7:
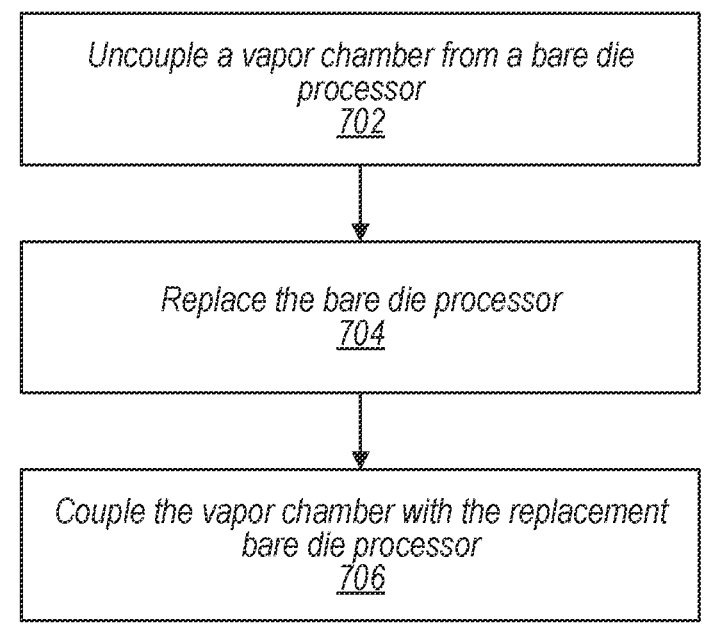
FIG. 7 illustrates an example method of servicing a serviceable processor module that includes a vapor chamber heat spreader for removing heat from a bare die processor, according to some embodiments.

FIG. 7 illustrates an example method 700 of servicing a serviceable processor module that includes a vapor chamber heat spreader for removing heat from a bare die processor, according to some embodiments. In some embodiments, the processor module may include the vapor chamber heat spreader, the bare die processor, and a mounting structure. The mounting structure may be configured to mount the vapor chamber heat spreader over the bare die processor, e.g., such that a bottom surface of the vapor chamber heat spreader is disposed within an interior of the processor module and is positioned proximate a top surface of the bare die processor. According to various embodiments, the vapor chamber heat spreader may include a wicking structure positioned between a top cover and a bottom cover. The top cover and the bottom cover may be configured to encase at least a portion of the wicking structure. The bottom cover may comprise a pedestal that extends out from a surface of the bottom cover, in a direction opposite the top cover. A bottom surface of the pedestal may be sized to match a top surface of the bare die processor.

At 702, the method 700 may include uncoupling the vapor chamber heat spreader from the bare die processor, e.g., so as to enable replacement (and/or repair) of one or more components of the processor module. In some embodiments, uncoupling the vapor chamber heat spreader from the bare die processor may include removing one or more removable fasteners used to couple the vapor chamber heat spreader and the mounting structure with the bare die processor. In a non-limiting example, the removable fasteners may include a plurality of screws. The screws may be removed from a plurality of holes (e.g., tapped holes) defined at least in part by the vapor chamber heat spreader and the mounting structure.

At 704, the method 700 may include replacing the bare die processor. For example, the bare die processor may be replaced due to a detected problem with the bare die processor. In some embodiments, the bare die processor may be replaced in order to upgrade the processor module with a newer bare die processor (e.g., a next generation processor). According to some embodiments, the bare die processor may be unplugged from a socket, and a replacement bare die processor may be plugged into the socket.

At 706, the method 700 may include coupling the vapor chamber heat spreader with the replacement bare die processor. For example, the vapor chamber heat spreader may be recoupled with the mounting structure using the removable fastener(s) that were previously removed and/or using other removable fastener(s). In some embodiments, recoupling the vapor chamber heat spreader with the mounting structure may including mounting the vapor chamber heat spreader over the replacement bare die processor, such that the bottom surface of the pedestal of the vapor chamber heat spreader is disposed within the interior of the processor module and is positioned proximate the top surface of the bare die processor.

Figure 8:
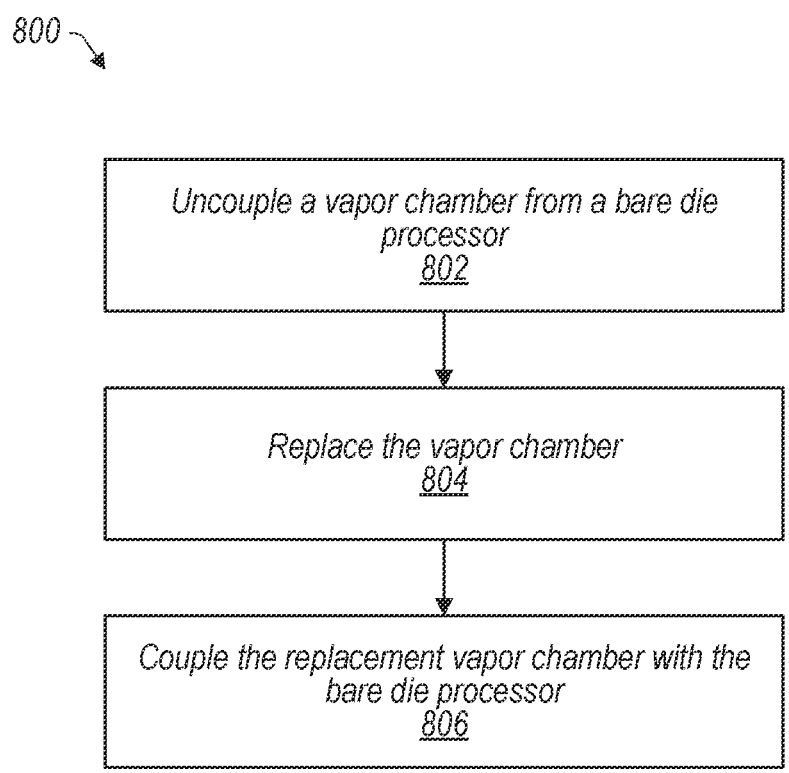
FIG. 8 illustrates another example method of servicing a serviceable processor module that includes a vapor chamber heat spreader for removing heat from a bare die processor, according to some embodiments.

FIG. 8 illustrates another example method 800 of servicing a serviceable processor module that includes a vapor chamber heat spreader for removing heat from a bare die processor, according to some embodiments. In some embodiments, the processor module may include the vapor chamber heat spreader, the bare die processor, and a mounting structure. The mounting structure may be configured to mount the vapor chamber heat spreader over the bare die processor, e.g., such that a bottom surface of the vapor chamber heat spreader is disposed within an interior of the processor module and is positioned proximate a top surface of the bare die processor. According to various embodiments, the vapor chamber heat spreader may include a wicking structure positioned between a top cover and a bottom cover. The top cover and the bottom cover may be configured to encase at least a portion of the wicking structure. The bottom cover may comprise a pedestal that extends out from a surface of the bottom cover, in a direction opposite the top cover. A bottom surface of the pedestal may be sized to match a top surface of the bare die processor.

At 802, the method 800 may include uncoupling the vapor chamber heat spreader from the bare die processor, e.g., as discussed at 702. At 804, the method 800 may include replacing the vapor chamber heat spreader. In some embodiments, replacing the vapor chamber heat spreader may include removing a heat exchanger (e.g., a heat sink) from a top surface of the vapor chamber heat spreader. The heat exchanger (and/or another heat exchanger) may be attached to a replacement vapor chamber heat spreader. At 806, the method 800 may include coupling the replacement vapor chamber heat spreader with the bare die processor. For example, the replacement vapor chamber heat spreader may be coupled with the mounting structure using the removable fastener(s) and/or other removable fastener(s). In various embodiments, coupling the replacement vapor chamber heat spreader with the mounting structure may include mounting the replacement vapor chamber heat spreader over the bare die processor, such that a bottom surface of the replacement vapor chamber heat spreader is disposed within the interior of the processor module and is positioned proximate the top surface of the bare die processor.

In methods 700 and 800, one or more thermal interface materials (TIMs) on interface surfaces (e.g., the top surface of the bare die, the bottom surface of the pedestal of the vapor chamber heat spreader, the top surface of the vapor chamber heat spreader, and/or the bottom surface of the heat exchanger) may be removed/cleaned and/or replaced in some examples.

The various methods as illustrated in the figures and described herein represent example embodiments of methods. The methods may be implemented in software, hardware, or a combination thereof. The order of method may be changed, and various elements may be added, reordered, combined, omitted, modified, etc.

Although the embodiments above have been described in considerable detail, numerous variations and modifications will become apparent to those skilled in the art once the above disclosure is fully appreciated. It is intended that the following claims be interpreted to embrace all such variations and modifications.

What is claimed is:

1. A computer system, comprising:
   a circuit board; and
   a processor module coupled to the circuit board, the processor module comprising:
      a bare die processor;
      a vapor chamber heat spreader configured to remove heat from the bare die processor, wherein the vapor chamber heat spreader comprises:

a top cover configured to mount with a heat exchanger;
a wicking structure configured to move condensed working fluid from the top cover to a pedestal via a capillary action; and
the pedestal, wherein the pedestal is configured to accumulate the condensed working fluid moved via the capillary action, wherein the wicking structure comprises:
a first wick portion comprising a screen wick; and
a second wick portion comprising a sintered wick that is encircled by the screen wick;
wherein:
the first wick portion is configured to wick the working fluid in a horizontal direction towards the second wick portion; and
the second wick portion is configured to wick the working fluid in a vertical direction towards the pedestal; and
a mounting structure configured to mount the vapor chamber heat spreader to the circuit board over the bare die processor, such that a planar bottom surface of the vapor chamber heat spreader is disposed within an interior portion of the processor module and the pedestal extending out from the planar bottom surface, in a direction opposite a top surface of the vapor chamber heat spreader, is positioned proximate a top surface of the bare die processor, wherein a bottom surface of the pedestal is sized to match the top surface of the bare die processor and wherein the pedestal forms a reservoir for the working fluid of the vapor chamber heat spreader.

2. The computer system of claim 1, wherein the vapor chamber heat spreader comprises:
the wicking structure positioned between the top surface and the bottom surface such that the top surface and the bottom surface encase at least a portion of the wicking structure.

3. The computer system of claim 2, wherein the vapor chamber heat spreader is coupled to the circuit board via the mounting structure and a removable fastener.

4. The computer system of claim 2, wherein:
the processor module further comprises:
a plurality of removable fasteners for coupling the vapor chamber heat spreader to the circuit board via the mounting structure; and
a plurality of holes for receiving the removable fasteners, comprising:
a first set of holes, comprising through holes defined by the vapor chamber heat spreader; and
a second set of holes defined by the mounting structure, wherein respective holes of the second set of holes are coaxial with respective holes of the first set of holes.

5. The computer system of claim 4, further comprising a heat exchanger attached to the top surface, wherein the heat exchanger comprises at least one of:
a heat sink;
a heat pipe; or
a liquid cold plate.

6. The computer system of claim 5, wherein:
the plurality of removable fasteners comprises a screw; and
a through hole of the first set of holes defined by the vapor chamber heat spreader comprises:
a tapped through hole having a countersink or a counterbore configured to accommodate a head of the screw, such that a top surface of the head is flush with, or below, the top surface of the vapor chamber heat spreader when the vapor chamber heat spreader is coupled to the mounting structure via the screw.

7. The computer system of claim 1, wherein the processor module further comprises:
a thermal interface material (TIM) in contact with the top surface of the bare die processor and the bottom surface of the pedestal, such that the bottom surface of the pedestal is in thermal communication with the top surface of the bare die processor via the TIM.

8. A vapor chamber heat spreader, comprising:
a top cover configured to mount with a heat exchanger;
a bottom cover; and
a wicking structure positioned between the top cover and the bottom cover such that the top cover and the bottom cover encase at least a portion of the wicking structure;
wherein the bottom cover comprises:
a pedestal that extends out from a planar surface of the bottom cover, in a direction opposite the top cover, wherein a bottom surface of the pedestal is sized to match a top surface of a bare die processor, wherein the pedestal forms a reservoir for a working fluid of the vapor chamber heat spreader, wherein the wicking structure is configured to move condensed working fluid from the top cover to the pedestal via capillary action, and wherein the pedestal is configured to accumulate the condensed working fluid moved via the capillary action, wherein the wicking structure comprises:
a first wick portion comprising a screen wick; and
a second wick portion comprising a sintered wick that is encircled by the screen wick;
wherein:
the first wick portion is configured to wick the working fluid in a horizontal direction towards the second wick portion; and
the second wick portion is configured to wick the working fluid in a vertical direction towards the pedestal;
wherein the vapor chamber heat spreader is configured to be coupled with a mounting structure for mounting the vapor chamber heat spreader over the bare die processor, such that the bottom surface of the pedestal of the vapor chamber heat spreader is positioned proximate the top surface of the bare die processor.

9. The vapor chamber heat spreader of claim 8, wherein the vapor chamber heat spreader is configured to be coupled to at least a portion of the mounting structure via a removable fastener.

10. The vapor chamber heat spreader of claim 8, wherein the vapor chamber heat spreader defines a plurality of through holes respectively configured to receive a removable faster for coupling the vapor chamber heat spreader to at least a portion of the mounting structure.

11. The vapor chamber heat spreader of claim 10, wherein the plurality of through holes are arranged so as to at least partially encircle the pedestal, with respect to directions along a plane that is parallel to the bottom surface of the pedestal.

12. The vapor chamber heat spreader of claim 8, wherein the vapor chamber heat spreader is configured such that, when coupled with the mounting structure for mounting the vapor chamber heat spreader over the bare die processor, the bottom surface of the pedestal is not in direct contact with the top surface of the bare die processor.

13. The vapor chamber heat spreader of claim 12, wherein the vapor chamber heat spreader is configured such that, when coupled with the mounting structure for mounting the vapor chamber heat spreader over the bare die processor, the bottom surface of the pedestal is in contact with a thermal interface material (TIM), wherein the TIM is also in contact with the top surface of the bare die processor.

14. A method, comprising:
servicing a processor module of a computer system, wherein:
the processor module comprises:
a bare die processor;
a vapor chamber heat spreader, wherein the vapor chamber heat spreader comprises:
a top cover configured to mount with a heat exchanger;
a wicking structure configured to move condensed working fluid from the top cover to a pedestal via a capillary action; and
the pedestal, wherein the pedestal is configured to accumulate the condensed working fluid moved via the capillary action, wherein the wicking structure comprises:
a first wick portion comprising a screen wick; and
a second wick portion comprising a sintered wick that is encircled by the screen wick;
wherein:
the first wick portion is configured to wick the working fluid in a horizontal direction towards the second wick portion; and
the second wick portion is configured to wick the working fluid in a vertical direction towards the pedestal; and
a mounting structure configured to mount the vapor chamber heat spreader over the bare die processor, such that the pedestal extending out from a planar bottom surface of the vapor chamber heat spreader is disposed within an interior of the processor module and is positioned proximate a top surface of the bare die processor, wherein a bottom surface of the pedestal is sized to match the top surface of the bare die processor and wherein the pedestal forms a reservoir for a working fluid of the vapor chamber heat spreader; and
the servicing the processor module comprises:
uncoupling the vapor chamber heat spreader from the bare die processor, so as to enable replacement of at least one of the bare die processor or the vapor chamber heat spreader, wherein the uncoupling comprises removing a removable fastener used to couple the vapor chamber heat spreader and the mounting structure with the bare die processor.

15. The method of claim 14, wherein:
the vapor chamber heat spreader comprises:
the wicking structure positioned between the top surface and the bottom surface such that the top surface and the bottom surface encase at least a portion of the wicking structure; and
wherein the removing the one or more removable fasteners comprises:
removing a plurality of screws from a plurality of tapped holes defined at least in part by the vapor chamber heat spreader and the mounting structure.

16. The method of claim 15, wherein the servicing the processor module further comprises:
replacing, after the uncoupling the vapor chamber heat spreader, the bare die processor with a replacement bare die processor; and
recoupling the vapor chamber heat spreader with the mounting structure using at least one of:
the removable fastener; or
another removable fastener.

17. The method of claim 16, wherein the recoupling the vapor chamber heat spreader with the mounting structure further comprises:
mounting the vapor chamber heat spreader over the replacement bare die processor, such that the bottom surface of the pedestal of the vapor chamber heat spreader is disposed within the interior of the processor module and is positioned proximate the top surface of the bare die processor.

18. The method of claim 15, wherein the servicing the processor module comprises:
replacing, after the uncoupling the vapor chamber heat spreader, the vapor chamber heat spreader with a replacement vapor chamber heat spreader, wherein the replacing comprises coupling the replacement vapor chamber heat spreader with the mounting structure using at least one of:
the removable fastener; or
another removable fastener.

19. The method of claim 18, wherein the coupling the replacement vapor chamber heat spreader with the mounting structure further comprises:
mounting the replacement vapor chamber heat spreader over the bare die processor, such that a pedestal extending out from a planar bottom surface of the replacement vapor chamber heat spreader is disposed within the interior of the processor module and is positioned proximate the top surface of the bare die processor, wherein a bottom surface of the pedestal of the replacement vapor chamber heat spreader is sized to match the top surface of the bare die processor.

* * * * *